United States Patent [19]

Kuninobu et al.

[11] 4,085,499

[45] Apr. 25, 1978

[54] METHOD OF MAKING A MOS-TYPE SEMICONDUCTOR DEVICE

[75] Inventors: Shigeo Kuninobu, Kyoto; Takeshi Ishihara, Neyagawa, both of Japan

[73] Assignee: Matsushita Electric Industrial Co., Ltd., Kadoma, Japan

[21] Appl. No.: 754,261

[22] Filed: Dec. 27, 1976

[30] Foreign Application Priority Data

Dec. 29, 1975 Japan .............................. 50-159294
Dec. 29, 1975 Japan .............................. 50-159295
Dec. 29, 1975 Japan .............................. 50-159296
Feb. 20, 1976 Japan .............................. 51-18098

[51] Int. Cl.² ............................................ B01J 17/00
[52] U.S. Cl. .................................................... 29/571
[58] Field of Search ..................... 357/23, 41; 29/571

[56] References Cited

U.S. PATENT DOCUMENTS 3,942,241  3/1976  Harigaya et al. .................... 29/571

*Primary Examiner*—Gerald A. Dost

[57] ABSTRACT

A method of making an MOS-type semiconductor device wherein the surface thereon for the conductors is flat. For this purpose, a polycrystalline silicon layer is provided and a part of the layer is selectively oxidized, so that the remaining portion of the layer acts as a lead for connecting a functional region such as a source region, a drain region etc. with the conductor layer. When said oxidization is performed, the diffusion from the polycrystalline silicon layer into the substrate occurs due to heating, so that said functional regions are formed at the same time.

2 Claims, 10 Drawing Figures

METHOD OF MAKING A MOS-TYPE SEMICONDUCTOR DEVICE

BACKGROUND OF THE INVENTION

This invention relates to a method of making an MOS-type semiconductor device having an improved flat surface on which a conductor layer is to be disposed.

Hitherto known silicon gate MOS-type semiconductor devices have usually had a construction as shown in FIG. 1. Numeral 1 represents a silicon substrate, wherein a source region 2 and drain region 3 are formed. On the silicon substrate 1 are provided insulating layers 4a and 4b of $SiO_2$ and gate insulating film 5 of $SiO_2$. A gate electrode 6 of polycrystalline silicon is provided on the gate insulating film 5. The insulating layer 4b has provided thereon a polycrystalline silicon layer 7 for a conductor. The insulating layers 4a and 4b, the gate electrode 6 and the polycrystalline silicon layer 7 are covered by insulating layers 8a, 8b and 8c of $SiO_2$. Conductor layers 9a and 9b of aluminum are provided for connection with the source region 2 and the drain region 3. Since steps are formed between the upper surfaces of the insulating layers 8a, 8b and 8c and the upper surfaces of the source 2 and the drain 3 in above-described construction, the thickness of the conductor layers 9a and 9b at the corners of the step is relatively small. Therefore the conductor layers 9a and 9b are easily broken at such portions. To avoid such breaking, the conductor layers 9a and 9b must be sufficiently thick or wide. Further the above-mentioned step reduces the accuracy of transcription in photo-lithography process. These are the factors preventing the device as shown in FIG. 1 from being included in integrated circuits to any great degree.

BRIEF SUMMARY OF THE INVENTION

The object of this invention is to provide an improved method of making an MOS-type semiconductor device wherein a flat surface for providing conductor layers thereon is formed before the step of forming wiring layers.

Another object of this invention is to provide such a method whereby the device can be made with high accuracy.

To achieve these objects, in the method according to this invention a polycrystalline silicon layer is provided on a region such as a source region or drain region so as to interconnect such regions with a conductor layer, and the polycrystalline silicon layer is separated into several regions by $SiO_2$ layers. The separated polycrystalline silicon layers and the $SiO_2$ separating layers are given the same thickness.

In the process of making such a device the $SiO_2$ separating layers are formed by selectively oxidizing the polycrystalline silicon layer which is deposited over the whole area of the face of the substrate, so that the remaining regions form the interconnecting polycrystalline silicon layers. Such oxidation is carried out by heating. Before the heating is carried out, an impurity is diffused into the specified region of the polycrystalline silicon layer. Therefore when the heating is performed, the impurity is diffused from the polycrystalline silicon layer into the silicon substrate, so as to form the source region, the drain region, etc.

DETAILED DESCRIPTION OF THE INVENTION

Figure 1:
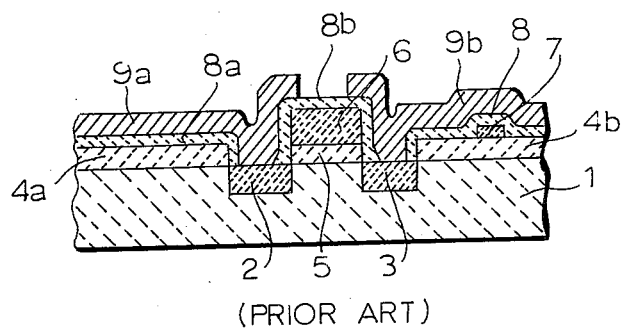
FIG. 1 is a sectional view of a conventional silicon gate MOS transistor.
Figure 2A:
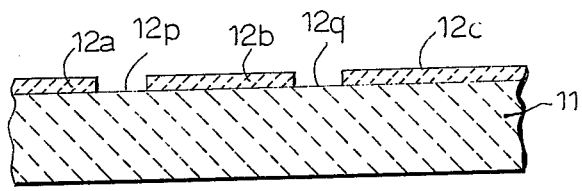
FIGS. 2A to 2E are sectional views illustrating the steps of the method of making an MOS-type semiconductor device according to this invention.

Referring to FIG. 2A, numeral 11 represents a P-type silicon substrate which is first prepared. As shown in FIG. 2A, $SiO_2$ layers 12a, 12b and 12c are provided on the principal face of the substrate 11. These $SiO_2$ layers are arranged in a pattern formed by a known photo-etching process. The $SiO_2$ layer 12b serves as a gate insulator. The location of the opening 12p between the $SiO_2$ layers 12a and 12b and the location of the opening 12q between the $SiO_2$ layers 12b and 12c correspond to the regions of the substrate 11 in which a source region and a drain region are to be formed.

Figure 2B:
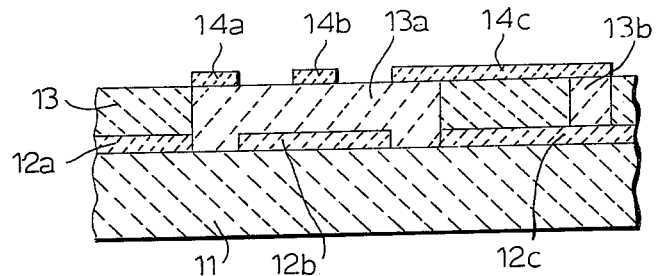

Next, a polycrystalline silicon layer 13 is provided on the above-described components to coat the whole face of the substrate and the $SiO_2$ layers. The polycrystalline silicon layer has an N-type impurity, e.g. As or P, selectively diffused into it to form diffused regions 13a and 13b, as shown in FIG. 2B, the remaining portions 13 being the original polycrystalline silicon regions. This selective diffusion is performed by employing a $SiO_2$ mask (not shown in the figures). The diffused region 13a corresponds to the MOS transistor regions where the source, drain and gate should be formed. The diffused region 13b corresponds to a terminal for a load resistor as hereinafter described.

Next, as shown in FIG. 2B, silicon nitride layers 14a, 14b and 14c are placed in a pattern on the layer 13. As the case may be $SiO_2$ layer is interposed under the silicon nitride layers. The silicon nitride layer 14a is on the part of the diffused region 13a which faces the opening 12p between the $SiO_2$ layer 12a and 12b. The silicon nitride layer 14b is above the $SiO_2$ layer 12b and its area is smaller than the $SiO_2$ layer 12b. The length of the silicon nitride layer 14b is determined according to the required channel length. The silicon nitride layer 14c is located at a position extending from above the opening 12q between the $SiO_2$ layer 12b and 12c to above the diffused region 13b.

The silicon nitride layers 14a, 14b and 14c are formed by plasma etching, with a photo resist layer (not shown) being used as a mask for forming them in the correct pattern.

Then the polycrystalline silicon layer 13 (including the diffused regions) is subjected to a selective oxidation process. Oxidized silicon has a volume larger than unoxidized silicon. Thus the thickness of the oxidized film becomes about two times that of the original polycrystalline silicon film. Therefore, prior to the oxidation, the polycrystalline layer 13 is etched to half its original thickness while employing the silicon nitride layers 14a, 14b and 14c and a photo resist layer (not shown) as a mask, so that the upper surface of the oxidized portions and the remaining portions will be level. This etching can be performed by chemical etching or plasma etching, but plasma etching is superior because it produces little undercutting.

After being etched, the polycrystalline silicon 13 is oxidized by heating in the regions which are not coated with the silicon nitride layers 14a, 14b, and 14c. The oxidized regions i.e. SiO₂ regions serve as insulating field layers 15a and separating regions 15b which devide the impurity diffused region 13a into three regions 16a, 16b and 16c. The region 16a is a source interconnecting region, and region 16c a drain interconnecting region. The region 16b is a gate region. There further remains a polycrystalline silicon region 13b, which serves as a terminal for the load resistor (hereinafter described).

Figure 2C:
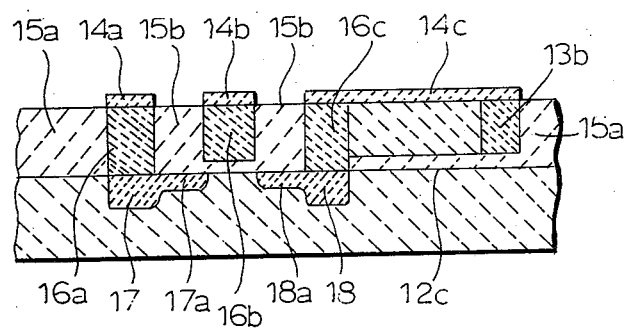

In above-described oxidizing process, the impurity is diffused as the result of heating from the diffused region of the polycrystalline silicon layer 13a to the substrate 11 as follows:

Under the openings 12p and 12q, as shown in FIG. 2A, the impurity is deeply diffused into the substrate, as shown in FIG. 2C. Under the gate insulator 12b except under the gate region 16b, the impurity is shallowly diffused through the gate insulator 12b. That is because the impurity-diffused polycrystalline silicon changes to a glass state by thermal oxidation, this glass-state silicon causes the SiO₂ layer under it to turn to a kind of melted state to form a kind of doped oxide, and from this doped oxide the impurity is diffused into the silicon substrate 11. This diffusion from the SiO₂ layer does not occur until after the polycrystalline silicon of layer 13a is completely oxidized. Therefore such diffusion is shallower than that through the openings in the SiO₂ layer through which the impurity directly diffuses from the polycrystalline silicon layer 13 into the silicon substrate 11. As a result, a source region 17 and a drain region 18 are formed having the structure as shown in FIG. 2C.

The diffusion does not occur from the regions located between the upper silicon nitride layer and the lower SiO₂ layer, i.e. the gate region 16b and the resistor terminal 13b.

The diffusion through the SiO₂ layer depends on the density of the impurity within the polycrystalline silicon.

The thickness of the above-described shallower diffused regions 17a and 18a of the source region 17 and the drain region 18 is controllable. Therefore, a short-channel MOS-transistor can be easily made by the above-described method.

Next, the silicon nitride layer 14a, 14b and 14c are removed.

Figure 2D:
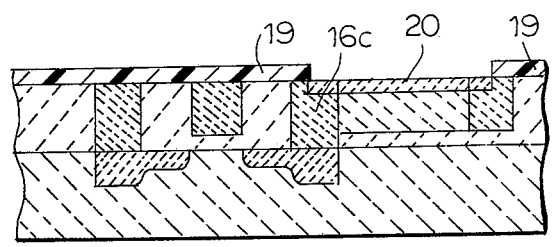

Then, as shown is FIG. 2D, a photo-resist mask 19 in provided other than in the region between the drain region 16c and the resistor terminal 13b. P or As is doped in a low density into the polycrystalline silicon layer through the mask 19 to form a resistor region 20. After removing the mask 19, the resistor region 20 is subjected to heating. The sheet resistance of the resistor region 20 can be made to be about several hundred KΩ/□, so that a load resistor can be formed which covers only a small area.

The ion-implantation can be performed without the mask 19, because the regions other than the region in which the resistor region 20 is formed are a thick SiO₂ layer or a high-density N-type polycrystalline.

Figure 2E:
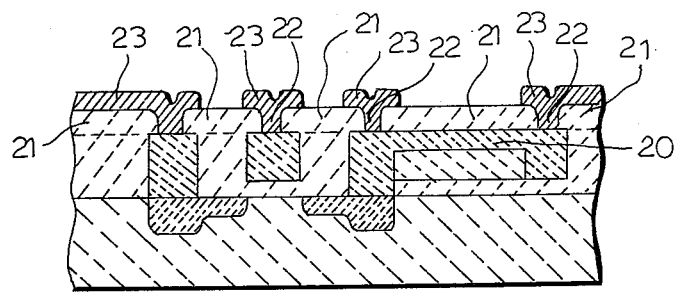

Next, as shown in FIG. 2E, an SiO₂ layer 21 is provided which coats the upper face of above-prepared structure by chemical vapour deposition. Contact openings 22 are made through the SiO₂ layer 21 so that a part of the upper face of each of the source interconnecting region 16a, the drain interconnecting region 16c, the gate region 16b and the resistor terminal 13b is exposed.

On the SiO₂ layer 21, Al conductors 23 are provided which fill the openings 22 so as to contact the source interconnecting region 16a, the drain interconnecting region 16c, the gate region 16b and the resistor terminal 13b. Thus the device is completed.

In the device as shown in FIG. 2E, the Al conductors 23 are electrically connected to the source region 17 or the drain region 18 through the interconnecting regions 16a or 16c. Since the Al conductors 23 contact the interconnecting regions near the surface of layer 21, they do not have a step therein i.e. they are provided on a practically flat plane.

By the above-described method, the source region 17 and the drain region 18 are formed when the polycrystalline silicon is oxidized to form the insulating field layers 15a and the separating regions 15b. And the area of the more shallowly diffused regions 17a and 18a are determined by the boundary between the gate region 16b and the separating region 15b. Therefore, the location of the gate region 16b and the source region 16a and the drain region 16c are self-aligned. Further the deep region and the shallower region of the source region 17 and the drain region 18 are formed simultaneously. Therefore a short-channel MOS transistor having the ability to withstand a high voltage can easily be made by this method.

Figure 3:
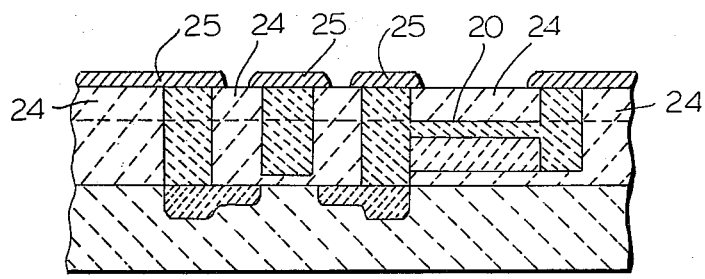
FIG. 3 is a sectional view illustrating another method of providing conductors in the method illustrated in FIGS. 2A to 2E.

Instead of the openings 22 in FIG. 2E, a polycrystalline silicon can be provided in these portions as follows;

Referring to FIG. 3, a dotted line shows the upper surface of the structure completed by the process of FIG. 2D. A polycrystalline silicon layer is then provided on the plane shown by the dotted line and is selectively oxidized other than at the portions corresponding to the openings 22 in FIG. 2E. Over the polycrystalline silicon portions and overlapping the oxidized portions 24 are provided conductors 25. Such a structure has an unbroken flat plane for depositing the conductors 25 thereon as compared with the embodiment of FIG. 2E.

Another method of making an MOS-type semiconductor device according to this invention is described hereinafter.

Figure 4A:
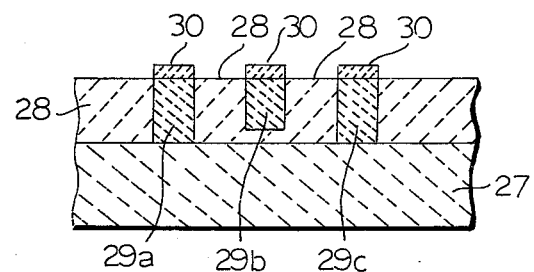
FIGS. 4A to 4C are sectional views illustrating another embodiment of a method of making an MOS-type semiconductor device according to this invention.
Figure 4B:
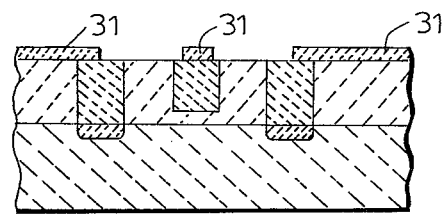
Figure 4C:
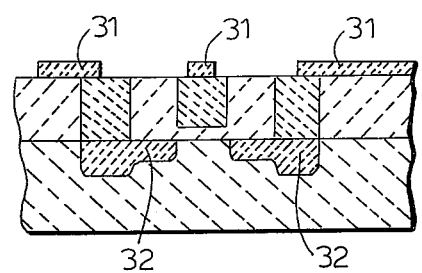

Referring to FIGS. 4A to 4C, FIG. 4A illustrates the step similar to FIG. 2C. On a substrate 27, polycrystalline silicon regions 29a, 29b and 29c are formed by selectively oxidizing a polycrystalline silicon layer to SiO₂ regions 28a, 28b and 28c through a first mask 30 of silicon nitride. But because impurity is not diffused into the polycrystalline silicon layer, diffusion of the impurity into the substrate does not occur, so that a source region, a drain region, etc, are not formed in this step.

After the silicon nitride mask 30 is removed boron is diffused into the polycrystalline silicon region as illustrated in FIG. 4B. At this time boron is shallowly diffused into the substrate 27. Next a second mask 31 of silicon nitride is formed. This mask 31 has a smaller area than the first mask 30 above the polycrystalline silicon gate regions. Then an impurity which is not masked by the SiO₂ layer, e.g. gallium, is diffused. Since the diffusion coefficient of gallium in polycrystalline silicon is greater than in SiO₂, shallowly diffused regions 32, as shown in FIG. 4C, are formed by controlling the length of time diffusing period.

What is claimed is:

1. A method of making an MOS-type semiconductor device, comprising the steps of:

forming a SiO$_2$ layer on a silicon substrate;

selectively etching the SiO$_2$ layer to form openings which are located in correspondence to regions where functional regions are to be formed in the silicon substrate;

coating the face of the thus formed structure with a polycrystalline silicon layer;

diffusing a first impurity into selected regions of the polycrystalline silicon layer;

forming a silicon nitride mask on selected surface areas of the polycrystalline silicon layer for preventing subsequent oxidation of the regions under said areas;

heating and oxidizing the region of the polycrystalline silicon layer other than that covered with the silicon nitride layer for diffusing the impurities into the silicon substrate from the polycrystalline silicon regions facing the substrate to form the functional regions and also diffusing said first impurity from the polycrystalline silicon region into the substrate through the SiO$_2$ layer for forming a shallowly diffused region having said impurity diffused thereinto to a depth less than the depth to which said substrate regions facing the polycrystalline silicon through said openings have had said impurity diffused thereinto;

removing the silicon nitride layer; and providing conductors on the exposed silicon oxide.

2. A method according to claim 1 further comprising diffusing a further impurity in a low concentration into a part of said polycrystalline layer into which said firstmentioned impurity has been diffused by said firstmentioned diffusing step and which has not been oxidized, to form a resistor region.

* * * * *